United States Patent [19]

Gelzer

[11] Patent Number: 5,472,085
[45] Date of Patent: Dec. 5, 1995

[54] GATED-POCKET TAPE-FORM PACKAGING SYSTEM

[75] Inventor: John R. Gelzer, Dublin, Ohio

[73] Assignee: GPAX International, Inc., Columbus, Ohio

[21] Appl. No.: 242,785

[22] Filed: May 16, 1994

[51] Int. Cl.⁶ .................................................. B65D 85/90
[52] U.S. Cl. ........................................................ 206/714
[58] Field of Search .................................. 206/328–334, 206/820

[56] References Cited

U.S. PATENT DOCUMENTS

| | | | |
|---|---|---|---|
| 3,331,497 | 7/1967 | Lunsford | 206/331 |
| 3,417,865 | 12/1968 | Suverkropp et al. | 206/331 |
| 4,708,245 | 11/1987 | Boeckmann et al. | 206/332 |
| 4,733,778 | 3/1988 | Boeckmann et al. | 206/332 |
| 4,747,483 | 5/1988 | Grabbe | 206/332 |
| 5,046,610 | 9/1991 | Runyon et al. | 206/330 |
| 5,066,245 | 11/1991 | Walker | 206/331 |
| 5,085,321 | 2/1992 | Chew | 206/331 |
| 5,119,934 | 6/1992 | Karasawa et al. | 206/330 |
| 5,136,827 | 8/1992 | Sawaya | 206/330 |
| 5,258,500 | 11/1993 | Alvite et al. | 206/330 |

FOREIGN PATENT DOCUMENTS

| | | | |
|---|---|---|---|
| 4006055 | 1/1992 | Japan | 206/330 |
| 5305985 | 11/1993 | Japan | 206/330 |

Primary Examiner—Jimmy G. Foster
Attorney, Agent, or Firm—Robert E. Stebens

[57] ABSTRACT

A gated-pocket, tape-form packaging system is provided having an elongated carrier tape which is formed with a series of longitudinally spaced apart pockets for containing of respective articles. The system includes a series of retaining fingers that cooperate in one embodiment with the pockets to directly mechanically engage with and effect retention of articles, but which, through mechanical manipulation of the tape, can be displaced to a position where they do not obstruct passage of an article either into or out of a pocket. An alternative construction includes a cover tape working in combination with the retaining fingers to perform the gating function. The cover tape is mechanically secured to the carrier tape by the retaining fingers which permit relative longitudinal displacement of the carrier and cover tapes to accommodate the difference in longitudinal length that occur as a consequence of the combination of two tapes being wound up onto a reel for storage or transport.

17 Claims, 5 Drawing Sheets

GATED-POCKET TAPE-FORM PACKAGING SYSTEM

FIELD OF THE INVENTION

This invention relates in general to a packaging system having particular utilization in the area of automated processing apparatus and equipment. It relates more specifically to a packaging system having an elongated carrier tape that is provided with a plurality of article-receiving pockets formed seriatim along the tape and which includes article-retaining means for selectively securing of articles in respective pockets. In its basic form, the article-retaining means comprises elements integrally formed from the carrier tape or secured to the carrier tape and positioned to cooperate with an article in a respective pocket to either secure the article in or to permit its removal from that pocket by mechanical manipulation of the carrier tape or the retaining means, or both.

BACKGROUND OF THE INVENTION

Manufacturing operations frequently involve assembly of a number of components into a finished product unit. It is advantageous from an economic standpoint to automate as many as possible of the assembly operations and, in particular, it is advantageous to provide apparatus and mechanisms that enable mechanized delivery or assembly of components or sub-components of an assembly for incorporation into a completed product unit. In typical operations of this nature, the components may be delivered at a work station where personnel may manually effect the assembly, but it is more advantageous to combine the tape-form packaging system with automated apparatus such as robotic-type mechanisms to effect the placement of the component or article carried by the tape packaging system into association with either a sub-assembly or a major component of a product unit.

Packaging systems designed to meet this general objective have been heretofore designed and utilized. These packaging systems generally comprise elongated flexible tapes of strip-form that are readily rolled or folded into compact packages for both economy of storage space and also minimizing transport costs. A previously patented example of the packaging system of this general type is disclosed in U.S. Pat. No. 4,583,641 granted Apr. 22, 1986 to John R. Gelzer, the named inventor in this application. That prior art packaging system comprised an elongated carrier tape to which a secondary or packaging tape was removably secured and the two tapes cooperated to retain articles in a loop-form assembly. The packaging tape was mechanically interconnected to the carrier tape by mechanical elements which enabled the two tapes to be readily separated at the assembly or utilization point for the articles and to thereby release the article or component previously retained with the packaging system. Such a packaging system as shown in this identified patent required that the two tapes be mechanically joined while concurrently receiving the article to be packaged in the completed tape system. At the point of utilization of the articles, the two tapes were mechanically separated and, if desired, the tapes could be reused by returning them to the source of supply for the articles and reassembled in packaging of additional articles. Alternatively, those tapes could be simply shreaded and the material then disposed of or recycled such as by remanufacture into new tapes for subsequent use in packaging of other articles in a similar manner.

Another example of a tape-packaging system designed to achieve the objectives of economical savings and facilitation of operations is disclosed in co-pending application, Ser. No. 07/862,640 filed by John R. Gelzer on Apr. 3, 1992 and assigned to the same assignee as the present application and titled "GATED-LOOP TAPE PACKAGING SYSTEM AND TAPE MANIPULATING APPARATUS". The tape packaging system disclosed in this application, Ser. No. 07/862,640, in general, comprised a carrier tape to which a second tape or other elements were secured to form loops into which the articles or components to be packaged could be placed and retained for storage until subsequent dispensing of the articles. The tape packaging system also included elements or components that function as gates for retaining of the articles or components in the respective loops. Those gating elements could be selectively manipulated at a desired time for displacement of the gating elements to a position where they would not be in obstructing relationship to the loop that is of a generally elongated cylindrical form and, thus, enable articles to be either inserted into or removed from a loop.

A technique disclosed in the '640 application for enabling displacement of the gating element to a non-obstructing position comprised forming of the gating element along a marginal edge portion of the carrier tape and with each gating element being in alignment with a respective loop. The tape was formed from a material that was sufficiently flexible to enable the marginal edge portion to be flexed laterally out of the normal plane of the tape and, thus, carry a gating element laterally out of alignment with respect to a component carrying loop.

Yet another tape packaging system that has been previously utilized for automated operations at assembly points of components comprises elongated, flexible tape formed with a series of article-receiving pockets and having a cover tape rigidly fixed to the carrier tape in overlying relationship to an open side of the respective pockets. This pocket-form tape has a disadvantage in that it is not easily adapted to roll up into compact reels for transportation, storage or for dispensing operations. The reason it is not readily adapted to roll up is that there is a difference in longitudinal length of the carrier tape and the cover tape that occurs as the two tapes have dissimilar diameters when rolled, even when in close association and, thus, there is an incremental difference in longitudinal lengths as between the two components. Consequently, as such a composite packaging tape is rolled up into a reel, there will be mechanical distortion of one or both of the tapes because of this incremental difference in length that occurs when rolled. The cover tape is rigidly secured to the carrier tape such as by means of adhesive and, thus, there is no capability for accommodating this change or differentiation in relative longitudinal length that occurs as this tape is wound up into a compact roll.

SUMMARY OF THE INVENTION

In accordance with this invention, a flexible tape-form packaging system is provided in which an elongated flexible tape designated as a carrier tape is formed with or provided with a plurality of respective compartments or pockets designed for receiving and retaining the components or articles. Retaining means is provided for selective securing of the articles or components in the respective pockets, but being selectively operable at a desired time to either permit an article to be inserted into a respective pocket or to be removed from a pocket. The article-retaining means is of a unique design that enables manipulation by associated and appropriate mechanisms to effect displacement of the retention means to a position where it does not obstruct passage of an article into or from a respective pocket. The retention means thus forms gating means that functions in a manner similar to that of the co-pending application of John R. Gelzer, Ser. No. 07/862,640.

One form of the tape packaging system embodying this invention comprises a carrier tape with the pockets formed longitudinally along the tape and having the retention means integrally formed with the carrier tape. The retention means in one embodiment takes the form of projections or finger-like elements that are configured and positioned to extend over the opening to the pocket and, thus, provide the mechanism for obstructing passage of an article into or out of the pocket.

Another embodiment of this invention includes a carrier tape which has the plurality of pockets formed in serial relationship along the longitudinal axis of the tape with these pockets having an open side which permits the passage of articles into or out of a respective pocket relative to the face of the carrier tape. In this embodiment, the retention means includes a flexible cover tape that is disposed in overlying relationship to the open side of the pockets to secure the articles in the pockets or to prevent their entrance, and also includes associated projections or finger-like elements carried and integrally formed with the carrier tape in positions to extend into cooperative engagement with the cover tape. Manipulation of the projections effects displacement of those projections to a position where they will enable the cover tape to be either placed in association with the carrier tape or to be removed therefrom.

The cooperative relationship between the projections and the cover tape is such that the cover tape is capable of being longitudinally displaced relative to the carrier tape and, thus, accommodates the difference in relative length that occurs during roll up of the combination into a reel. Another aspect of this embodiment is the capability of the cover tape to be dimensioned to completely cover and overlie the pockets and, thus, provide complete mechanical protection to the articles which are packaged with this packaging system.

These and other objects and advantages of this invention will be readily apparent from the following detailed description of the several embodiments and the accompanying drawings.

DESCRIPTION OF THE DRAWING FIGURES

DESCRIPTION OF THE ILLUSTRATIVE EMBODIMENTS OF THE INVENTION

Figure 1:
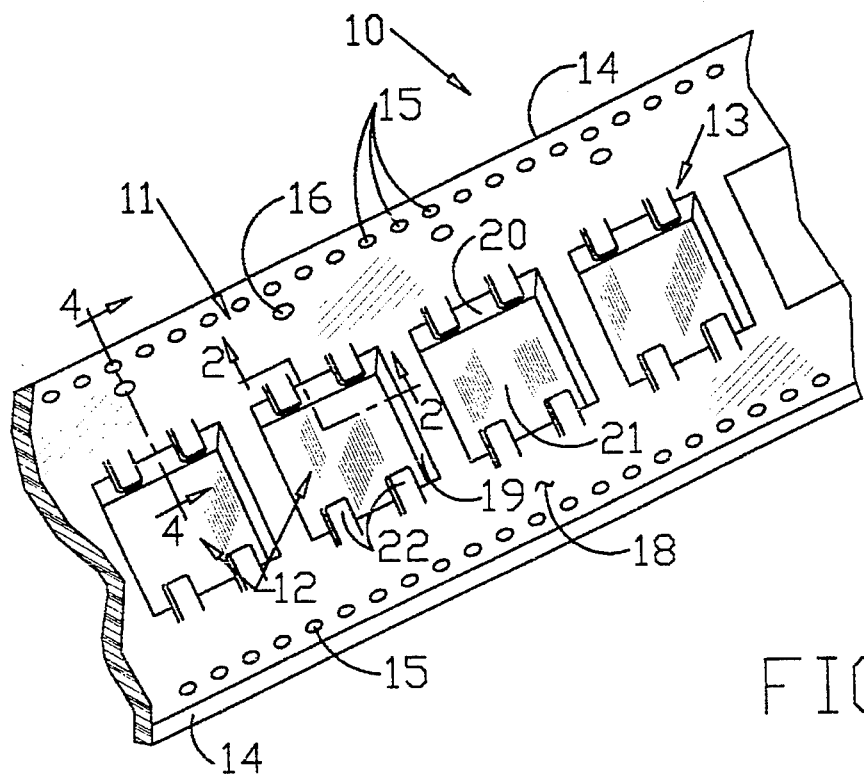
FIG. 1 is a perspective view of a length of a gated-pocket tape packaging system embodying this invention.

Having reference to the drawings, specifically FIGS. 1–5, a gated-pocket tape-form packaging system designated generally by the numeral 10 and embodying this invention is shown both as to structure and its functioning. This packaging system comprises an elongated carrier tape 11 formed with a plurality of article-receiving pockets 12 which are each configured to cooperatively receive a respective article A. Also included in the packaging system is article-retaining means designated generally by the numeral 13 which functions to maintain the articles in their respective pockets, but can be selectively manipulated to enable articles to be removed from the pockets or to be inserted into the pockets.

The carrier tape 11 is formed from a suitable material such as a plastic having a characteristic such that in the relatively thin thickness that it is formed, will have a desired degree of flexibility. It is flexible to the extent that from a longitudinal standpoint, it can be rolled into compact reels for purposes of storage and transportation as well as being unreeled for operation in dispensing of the articles at a point of use. This tape is of a predetermined width and is formed with opposed longitudinally extending edges 14 which are spaced a distance laterally outward with respect to the pockets 12. A tape packaging system of this type is generally intended for utilization in automated loading and dispensing apparatus requiring the relatively precise longitudinal movement of the tape as well as indexing to locate a pocket and its associated article at a particular point for either loading or dispensing. This precise positioning of the tape is accomplished by formation of a series of sprocket drive apertures 15 along each longitudinal edge 14 with a plurality of indexing apertures 16 also provided in longitudinal alignment adjacent one of the longitudinal edges 14. These sprocket drive apertures 15 are of a diameter and longitudinally spaced in accordance with predetermined standards that are commonly followed in formation of tape type packaging systems. These apertures are adapted to engage with sprocket pins on the drive sprocket wheels (not shown) as their structure and functioning is well-known in this particular art. Similarly, the indexing apertures 16 are of a size appropriate for the particular detecting mechanism that will be utilized with the packaging system. That indexing apparatus may include optical elements to function as the sensing of the location of the tape and is functional as is well-known in this art to result in indexing of the tape longitudinally to position a respective pocket and its article at a selected location such as the point where the article is to be utilized or is caused to engage with further mechanisms for effecting the dispensing and apparatus for placing the article into a product unit or its component.

Figure 2:
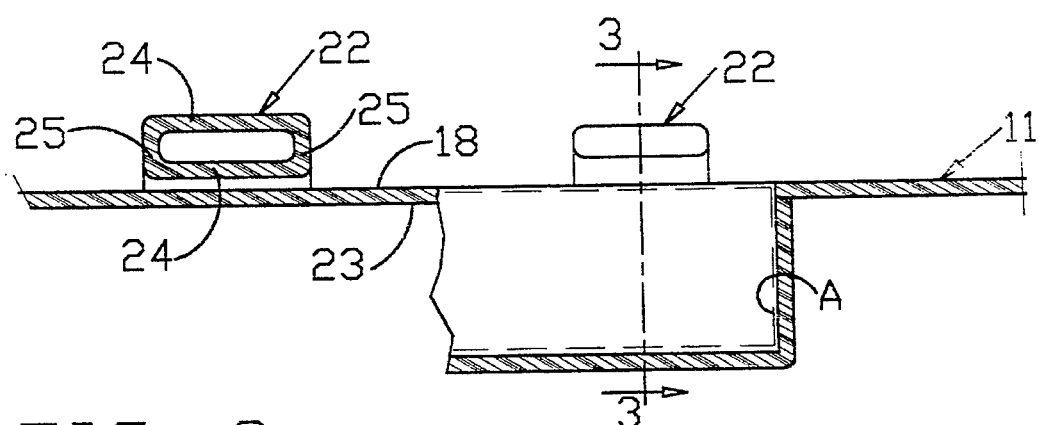
FIG. 2 is a fragmentary sectional view on an enlarged scale taken along line 2—2 of FIG. 1.
Figure 3:
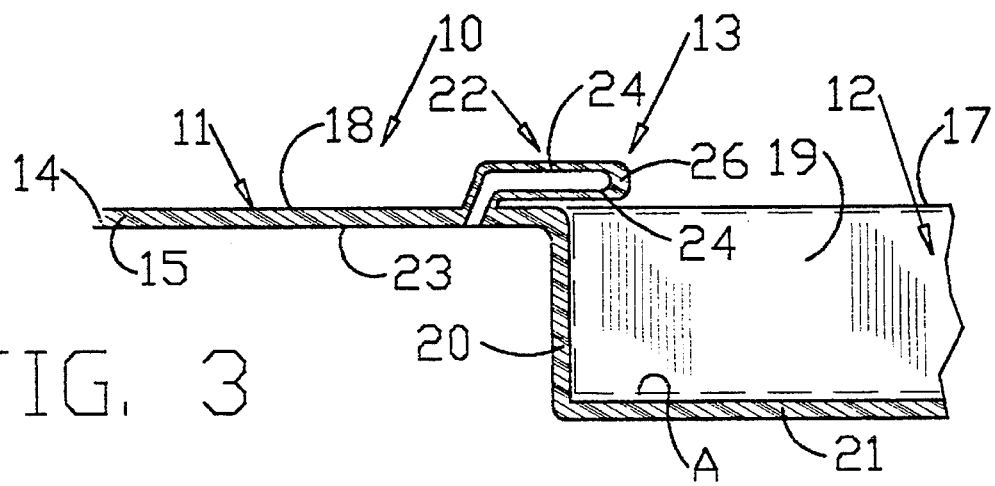
FIG. 3 is a fragmentary sectional view taken along line 3—3 of FIG. 2.

In this illustrative embodiment of the packaging system of the invention, each of the article-receiving pockets 12 is integrally formed in the carrier tape. These pockets, as can be seen in the FIGS. 1, 2 and 3, are configured to closely interfit with the particular article A which, in this instance, is shown as being of a rectangular shape in plan view and of a predetermined thickness. This is a common practice with many articles to be packaged with tape systems as the tape is designed to be utilized in most cases with only one particular size and configuration of article. Consequently, each of the pockets 12 is of a recessed type which is formed with an opening 17 that is co-extensive with a first face 18 of the carrier tape. These pockets are formed with transverse sidewalls 19 joined by interconnecting end walls 20 and provided with a closing bottom wall 21.

The technique of forming the pockets is dependent upon, and dictated to a large extent, by the type of material from which the carrier tape is formed and the configuration desired for the particular pockets. In this illustrative embodiment, the pockets are easily formed by application of heat to the carrier tape when it is in a planar form and then applying pressure by means of forming dies to project the affected portion of the carrier tape into the side and end walls and the bottom wall. This particular technique of formation results in a pocket that is closed, except for the top opening 17 at the first face of the carrier tape. Such a closed formation of the pocket results in a structure that provides physical protection for the article as well as maintaining the article in a precise position with respect to the carrier tape. Depending upon the type of article that is to be packaged, these pockets may be formed in many diverse manners and they may also be of an open-type configuration. Specifically, if the article to be packaged does not require a great deal of physical protection, the sidewalls and bottom wall of the pockets may be of an open lattice construction or have a number of apertures formed therein. Also, the pockets need not be integrally formed with the carrier tape and could be structures that are separately formed and either adhesively bonded to the carrier tape or otherwise secured such as by electronic welding.

Spacing of the pockets 12, as shown in FIG. 1, is intended to be illustrative. Just as the pockets may be of a different size as to width and length, as well as depth, they may be spaced at different longitudinal intervals than is shown in the drawings.

Functioning to either secure an article A in a respective pocket or operative to permit its removal or entrance into the pocket, are respective article-retaining means 13. In this illustrative embodiment, the article-retaining means 13 comprises pairs of elongated fingers 22 that are secured to the carrier tape at its first face 18 and are of a dimension to project a distance inwardly over the respective pockets 12. In this illustrative embodiment, two of these fingers 22 are provided at each lateral side of the pocket. Those fingers 22, in this embodiment, are shown as being integrally formed from or with the carrier tape. Each finger is formed by pressure and heat application to the carrier tape at the point where the fingers are to be formed with the formation process being diagrammatically illustrated in FIG. 5. As an initial step, a suitably configured and shaped tool (not shown) would be pressed against the second face 23 of the carrier tape at a location which is closely adjacent to, but laterally outward, with respect to the end wall 20 of the pocket. At this initial stage of the formation of a finger, it is in the form of a projection that extends upward from the first face 18 of the carrier tape at an angle of 30 degrees to the tape's face. Once this preliminary finger formation has been completed, a second step in the formation sequence will then effect lowering of the angle of the projection into an orientation that is more nearly parallel to the plane of the carrier tape's first face. This is shown diagrammatically in broken lines in FIG. 5.

The specific configuration of the finger 22 can be seen in greater detail in FIGS. 2 and 3. It includes opposed sidewalls 24 that, in the completed conformation, lie parallel to the carrier tape and its first face 18, with those side walls being interconnected by integrally formed edge walls 25. These fingers, as previously indicated, can be formed by application of heat and pressure and will form relatively rigid structures when completed. Accordingly, they are functional to cooperate with a respective article in the associated pocket and to maintain that article in that pocket. While two such fingers are shown at each lateral side of a pocket, it will be understood that the number may be decreased or increased as appropriate for a particular article and the size of the pocket. Similarly, the longitudinal spacing of adjacent pairs of fingers may be adjusted to best accommodate the particular article as is the length of the fingers and the distance to which the terminal end 26 of a finger projects over the opening 17 of a pocket. Vertical positioning of a finger is also dictated by the type of article and its configuration and in the illustrative embodiment, is shown as being of a shape and size that an upper surface of the article is commensurate with the first face of the carrier tape. Thus, the fingers are formed to be positioned closely adjacent to the first face 18 of the tape and will thus overlie and be in close adjacent relationship to the article and serve to maintain the article in the respective pocket. By appropriately dimensioning the finger and its positioning, it is possible that the finger will be in physical contact with the article and, thus, function to maintain the article in stationary fixed relationship with respect to the pocket.

Figure 4:
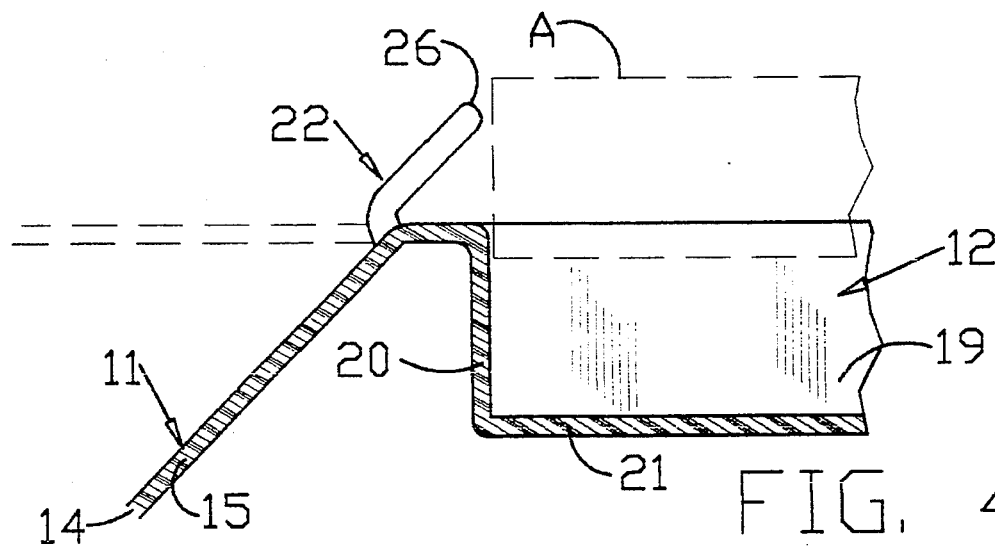
FIG. 4 is a fragmentary sectional view as taken along line 4—4 of FIG. 1, but showing the outer marginal edge portion of the carrier tape manipulated to displace the article-retaining finger to a non-obstructing position relative to the pocket.
Figure 5:
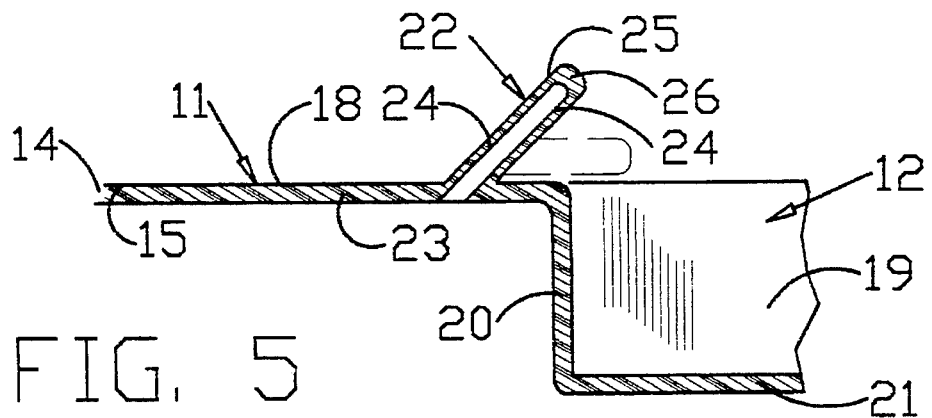
FIG. 5 is a fragmentary sectional view as taken along line 3—3 of FIG. 2, but showing the retaining finger at an intermediate stage in its formation, its completed formation shown in broken lines.

By manipulation of longitudinal marginal edge portions of the carrier tape laterally outward with respect to a pocket it is possible to effect displacement of the fingers 22 from a first position such as is shown in FIGS. 2 and 3 for securing and retaining of an article in a pocket to a second position such as that which is shown in FIG. 4. In this second position, the fingers will be oriented to project in a relatively outward relationship to the normal plane of the first face 18 of the carrier tape 11 and be laterally displaced with respect to the respective end wall 20 of a pocket. As is indicated in FIG. 4, the terminal end 26 of the finger will thus be located laterally outward with respect to the inwardly facing surface of an end wall 20. An article A may be positioned as shown in broken lines in FIG. 4 at a position where it can pass into or out of the respective pockets. Manipulation of the marginal edge portion of the carrier tape can be readily effected by suitable mechanical structures. For example, it is readily possible to effect manipulation of the marginal edge portion to the position as is shown in FIG. 4 by mechanisms which hold the central portion of the tape and its pockets in a fixed position with respect to the plane of the first face and then causing the marginal edge portion to be flexed laterally out of the normal plane to an angular position as is shown in FIG. 4. With sufficient flexing, it is possible to orient the finger in the illustrated position where it will be in non-obstructing relationship to passage of an article into or out of the respective pockets. Mechanisms for effecting this manipulation of the marginal edge portion of the tape can be in the form of rails or similar guiding mechanisms that are oriented to engage with the longitudinal edge portions of the carrier tape and to displace it laterally. Such mechanisms may be of a type as shown in the co-pending application, however, it will be understood that other mechanisms may be employed to effect this flexing displacement of the marginal edge portion of the tape.

While the preceding description only describes the operation of this embodiment of the tape-form packaging system as including flexing of only one marginal edge portion of the carrier tape, it is advantageous to simultaneously flex the marginal edge portions at both sides of a pocket. This results in a more complete gating function as the fingers at both laterally spaced ends of a pocket will be simultaneously cleared, providing a completely unobstructed path for movement of an article either into or out of a pocket. With the fingers thus selectively positionable either in an obstructing or in a non-obstructing position with respect to the open side of a pocket, it can be readily seen that the tape-form packaging system provided by this invention is an advantageous gated-pocket system.

Figure 6:
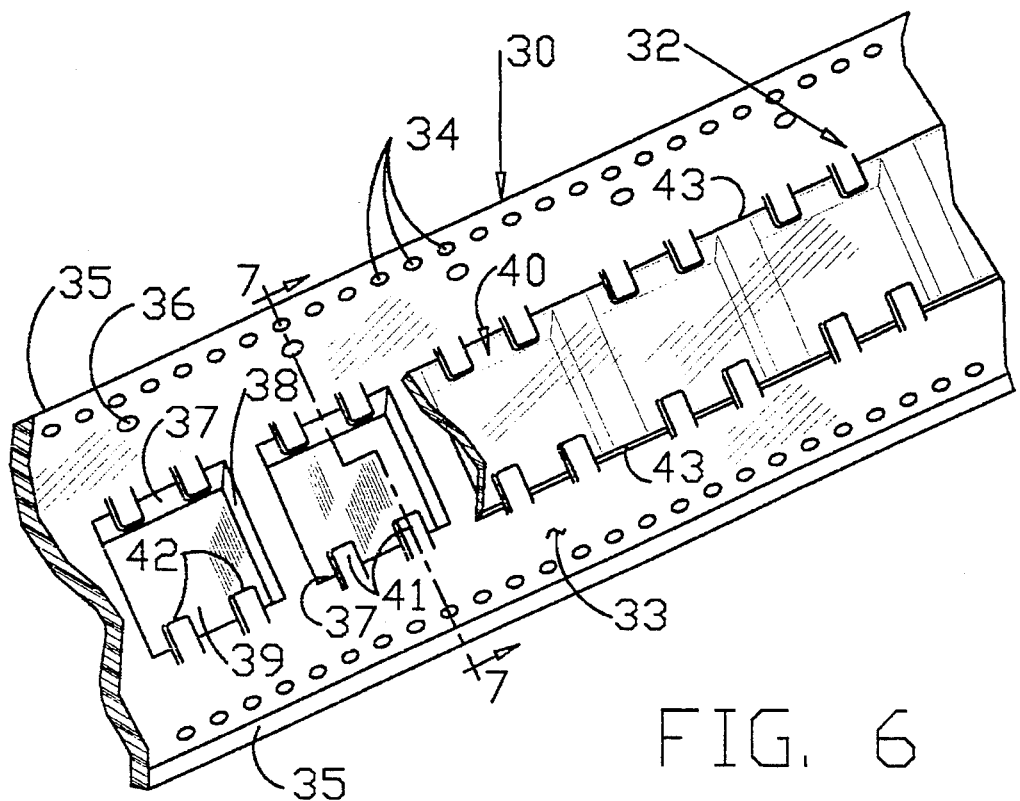
FIG. 6 is a perspective view of a length of a gated-pocket tape packaging system provided with a cover tape embodying this invention.
Figure 7:
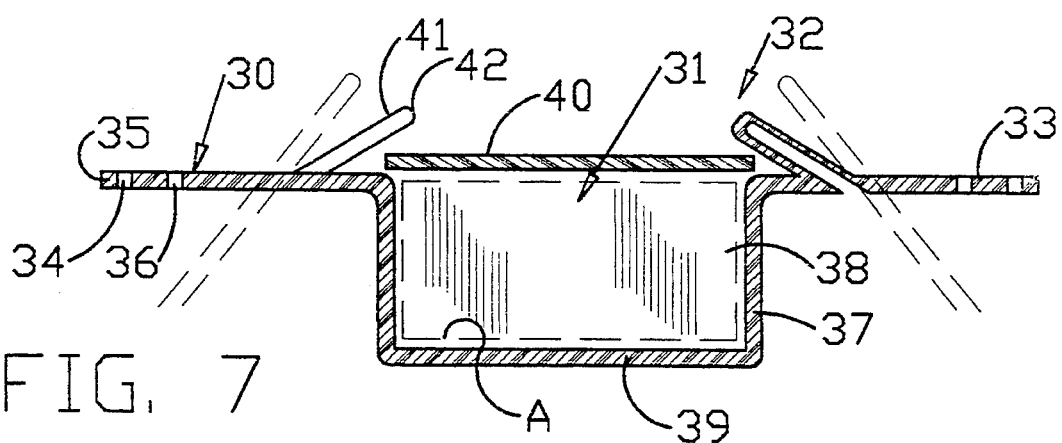
FIG. 7 is a sectional view on an enlarged scale taken along line 7—7 of FIG. 6.

A length of a modified gated-pocket tape packaging system embodying this invention is shown in FIGS. 6 and 7. This modified packaging system also includes a carrier tape 30 formed with a plurality of article-receiving pockets 31 disposed longitudinally thereof in relatively spaced relationship. Also included is article-retaining means 32 which performs the same general function as previously outlined with respect to the first described embodiment of the tape-form packaging system. The carrier tape 30 also includes a first face 33 with drive sprocket apertures 34 disposed in longitudinal alignment adjacent each of the opposed longitudinal edges 35. This tape is also provided with indexing apertures 36 that are located with one such aperture in alignment with each of the respective pockets.

In this illustrative modified embodiment of the packaging tape, each of the pockets 31 is also of a rectangular shape to accommodate a respective article A. They are configured to suitably enclose the articles in accordance with techniques as described in association with the embodiment of FIG. 1. As such, each of the pockets 31 is formed with an end wall 37 at opposite sides and which extends in longitudinal alignment with the end wall of other pockets. These end walls are interconnected by transversely extending sidewalls 38 with the bottom closed by a wall 39.

In this embodiment of the packaging system, the article-retaining means 32 includes an elongated cover tape 40 in combination with a plurality of retaining fingers 41. This cover tape 40 is also formed from a suitable type of plastic material to be sufficiently flexible. The retaining fingers 41 are also being integrally formed with the carrier tape 30 in a manner similar to that described with respect to the first embodiment as shown in FIGS. 1–5. This cover tape is of a width that is essentially equal to the transverse width of the pockets 31 and extends between the end walls 37. It thus is effective to overlie the articles within the respective pockets and provides additional physical protection and assistance in maintaining the articles in the pockets. The retaining fingers 41 are integrally formed with the carrier tape and are oriented in this embodiment to project not only laterally over the respective pockets, but to extend in an angular, laterally offset relationship to the outer surface of the first face 33 of the tape. They are of a length which will result in their terminal ends 42 being positioned relatively inward of the respective end walls 37 of the pockets and, thus, provide mechanical means for securing of the cover tape and to also provide means for retaining the articles against lateral displacement out of the pocket. Through appropriate configuration of the retaining fingers 41, they will effectively engage with the respective longitudinal edges 43 of the cover tape. Thus, they will serve to not only retain the cover tape against lateral displacement from the carrier tape, but also against displacement over the surface of the first face 33 of the carrier tape. It will also be noted that in this embodiment, two such fingers are shown as associated with each pocket. Again, the number of fingers associated with a pocket can be varied in accordance with particular design requirements.

Functioning of the article-retaining means 32 in this embodiment can be accomplished through manipulation of marginal edge portions of the carrier tape as described in association with the first illustrative embodiment of FIGS. 1–5. This manipulation can be accomplished by flexing the outer marginal edge portion of the carrier tape in the space between the end walls 37 and the respective longitudinal edges 35 of the carrier tape. Such manipulation can be accomplished by guide rails, as previously indicated and described in particular as to a specific embodiment in the co-pending application. Through sufficient flexing of the marginal edge portion, such as is shown diagrammatically in broken lines in FIG. 7, will result in the fingers 41 being displaced to a non-obstructing position. In the diagrammatically illustrated non-obstructing position, the fingers will not only not overlie the article, but they will permit the cover tape to be removed or placed in operative relationship to the carrier tape. With the cover tape removed and the fingers 41 flexed to a displaced position, articles may then be inserted into respective cavities or pockets or removed therefrom. Both marginal edge portions of the tape at a pocket are advantageously simultaneously flexed to facilitate removal or assembly of the cover tape and place the fingers 41 at both sides in a non-obstructing position. As previously indicated, a particular advantage of this construction of the article-retaining means is that it provides essentially complete physical protection for the articles that are retained in the pockets 31.

This embodiment of the packaging system as shown in FIGS. 6 and 7 not only has the advantageous feature of a cover tape 40 that provides further physical protection for the articles, as well as assisting in their retention in a respective pocket, but provides the further advantage of being capable of roll-up into a reel for storage and transport. The mechanical interengagement of the fingers 41 with the cover tape 40 effects securing of the cover tape to the carrier tape 30, but it also enables those two tapes to be relatively displaced longitudinally during roll-up and thereby accommodate the difference in length between the two tapes that occurs as they are wound up into a reel. This difference in length is of small dimension, but it is of significant magnitude and is sufficient to cause undesirable distortion if the tapes could not be longitudinally displaced with respect to each other. As a consequence of this displacement capability, the tape packaging system of this invention has the further advantage when compared with the prior art tape-form packaging systems having a cover tape fixedly secured, such as by adhesive, to a carrier tape having article-receiving pockets.

Figure 8:
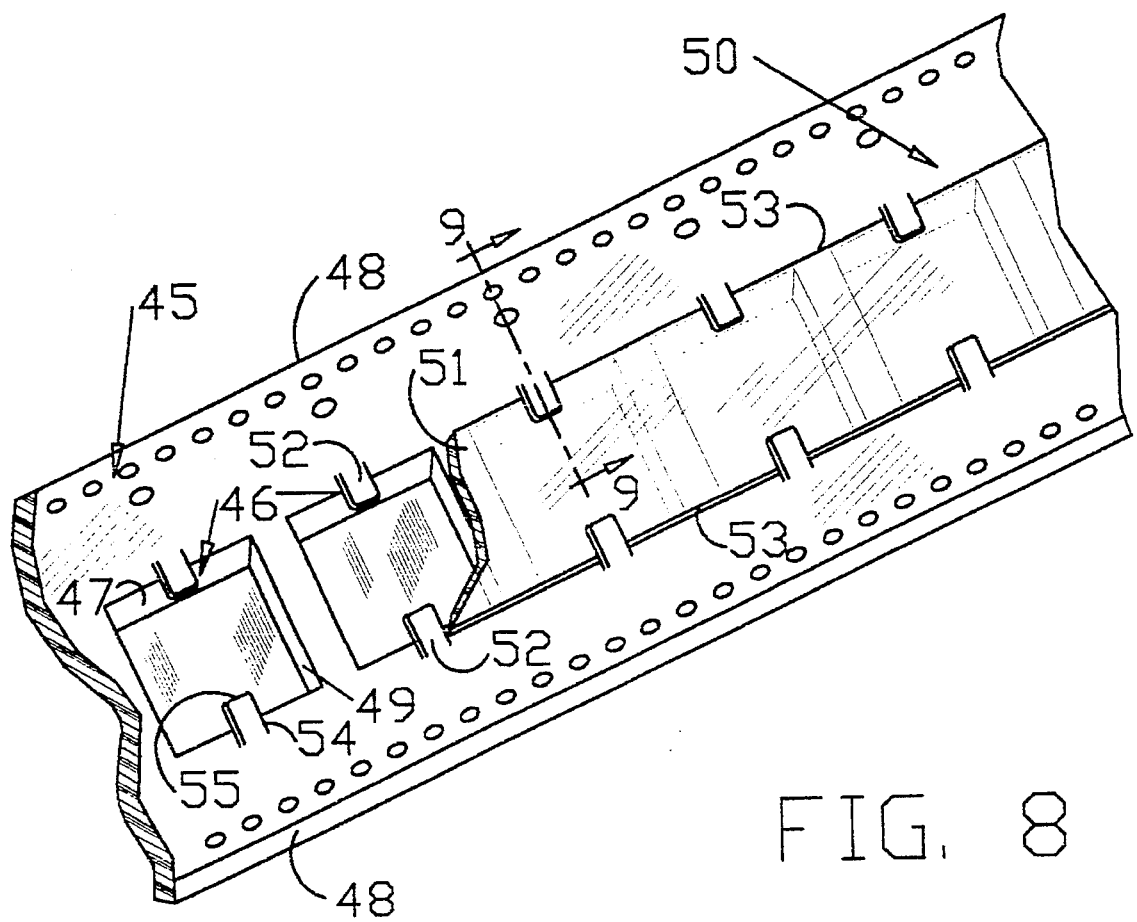
FIG. 8 is a perspective view of a length of a modification of the gated-pocket tape packaging system shown in FIG. 6.
Figure 9:
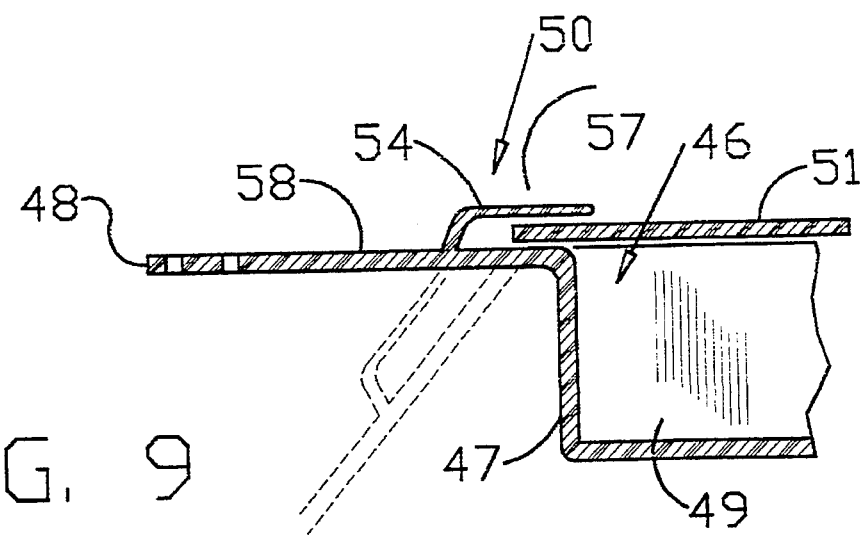
FIG. 9 is a fragmentary sectional view on an enlarged scale taken along line 9—9 of FIG. 8.

Another modified form of the tape packaging system is illustrated in FIGS. 8 and 9. This modified form also includes a carrier tape 45 provided with a series of longitudinally aligned article-receiving pockets 46. These pockets 46 are also of a generally rectangular shape having longitudinally extending end walls 47 that are spaced a distance inwardly from each respective longitudinal edge 48 of the carrier tape. These end walls 47 of the pockets are similarly interconnected by transversely extending sidewalls 49, thus defining a rectangular space in which the articles are to be retained.

In this embodiment of the packaging system, the system includes article-retaining means indicated generally by the numeral 50. This article-retaining means 50 is similar to that of the embodiment shown in FIGS. 6 and 7 and also comprises an elongated cover tape 51 and a plurality of retaining fingers 52. It will be noted that in this embodiment, the cover tape 51 is of a transverse width that is greater than the transverse width of the pockets 46 with longitudinal edges 53 of the cover tape thus lying a distance outwardly with respect to the end walls 47 of the pockets. Again, the cover tape is formed from a suitable plastic material to have the desired degree of flexibility to permit the combined structure to be readily rolled or coiled into a compact shape for transport or storage.

In this embodiment, the retaining fingers 52 are also integrally formed from the carrier tape, but are of a different structure than that illustrated and described with respect to the two previously described illustrative embodiments. These retaining fingers 52 comprise U-shaped elements that can be advantageously die cut from the carrier tape and, thus, have longitudinal edges 54 that extend transversely of the tape and a terminal end 55. Each of these fingers being die cut from the carrier tape has a joining end 56 which is integrally formed with the carrier tape. It is advantageous to further form those fingers such as by application of heat and pressure to result in the fingers 52 being displaced out of the plane of the carrier tape to a parallel plane as is best seen in FIG. 9. This displacement of the fingers is of a dimension such that the space between the underlying surface 57 of the finger functions with the cover tape 51 as shown in FIGS. 8 and 9 and is similar to that as previously described. The cover tape 51 overlies the pockets 46 and serves to retain the articles in the respective pockets. This cover tape, since it is not physically secured to the carrier tape, can also move longitudinally and accommodate the incremental differences in relative lengths that occurs when the two tapes are rolled into a reel as a unit.

Manipulation of the tape packaging system can also be readily accomplished to enable and permit removal of the cover tape or its application so as to permit articles to be either inserted into or removed from the respective pockets. Again, this can be accomplished by flexing of the carrier tape along its longitudinal marginal edge portions to cause those edge portions to be displaced out of the normal planar configuration into an angular relationship as is shown in broken lines in FIG. 9. When thus manipulated, the respective fingers 52 will be displaced to an angular position where they will not be in overlying relationship to the cover tape. Thus, the cover tape can be either placed on the carrier tape or removed therefrom and by such positioning, either expose or close the respective pockets.

Figure 10:
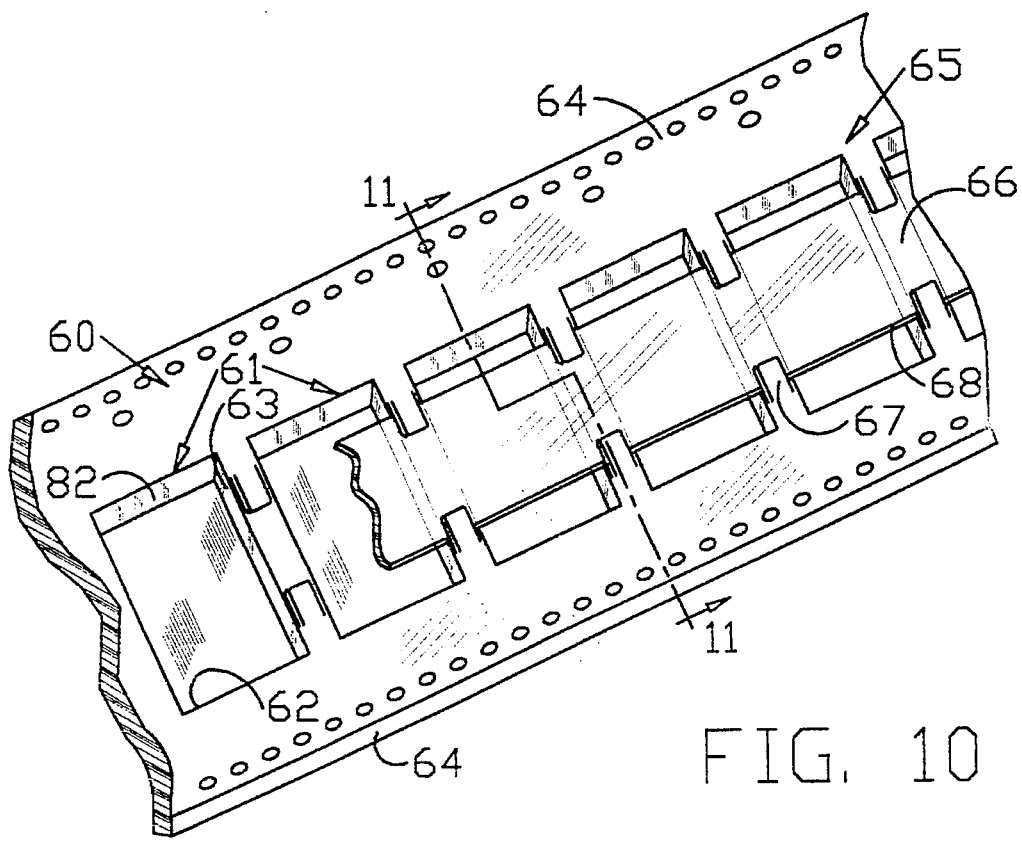
FIG. 10 is a perspective view of a length of another modification of the gated-pocket tape packaging system shown in FIG. 6.
Figure 11:
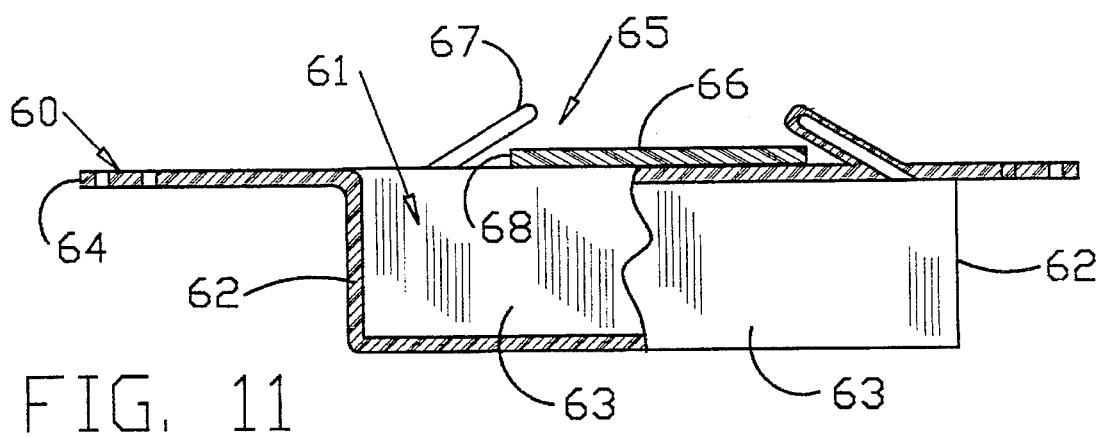
FIG. 11 is a sectional view on an enlarged scale taken along line 11—11 of FIG. 10.

A further modification of the tape packaging system embodying this invention and utilizing the gated-pocket principle, is illustrated in FIGS. 10 and 11. This modified packaging system also includes a carrier tape 60 which is formed with a plurality of article-receiving pockets 61 arranged in longitudinally spaced relationship. Each of these article-receiving pockets 61 is formed in a rectangular configuration similar to that described with respect to the preceding tape systems and includes transversely spaced end walls 62 interconnected by transversely extending sidewalls 63. The carrier tape 60 includes longitudinal edges 64 which are spaced a distance laterally outward with respect to the pocket end walls 62. Article-retaining means 65 is also provided and it comprises an elongated cover tape 66 in combination with a plurality of retaining fingers 67. This cover tape 66 is of a transverse width that is substantially less than the transverse width of the respective pockets 61, with the longitudinal edges 68 of the cover tape thus being disposed a distance inwardly with respect to those end walls 62. The retaining fingers 67 of the embodiment shown in FIGS. 10 and 11 are of a construction that is similar to that shown in FIGS. 6 and 7 and described in association therewith. They are integrally formed from the carrier tape and are of a shape to extend angularly over the cover tape. These retaining fingers, however, are formed at a location which is closely adjacent to the longitudinal edges 68 of the cover tape and, thus, they are formed with the carrier tape in the spaces between adjacent transverse side walls 63 of the pockets. In this embodiment, the carrier tape 60 cannot be readily flexed to cause displacement of the fingers 67 to a nonobstructing position. This particular embodiment is adapted to a technique whereby either auxiliary mechanisms of a mechanical nature are utilized to engage with the fingers and displace them to a non-obstructing position or, alternatively, the tape can be forcibly stripped from engagement with the respective fingers. Obviously, with the forcible stripping technique the packaging system, as shown in FIGS. 10 and 11, is not readily adapted to a technique where, after the articles are placed in the pockets, the carrier tape can be applied by reverse movement of the fingers. Consequently, this modification of the packaging tape is adapted to the technique where the cover tape is placed over the pockets and the fingers 67 are completed in their formation to extend angularly over the cover tape.

While the embodiment of the tape-form packaging system shown in FIGS. 10 and 11 is not designed to be adaptive to mechanical manipulation to effect the gating function as in the manner of the embodiments shown in either FIGS. 6 and 7 or FIGS. 8 and 9, it can be structurally modified so as to be susceptible to similar mechanical manipulation. For example, the pockets may be formed with transverse sidewalls that are relatively thin-walled and susceptible to deformation when the carrier tape is flexed. Another alternative construction that would be adaptive to flexing would have the transverse sidewalls and bottom wall of the pockets slit and cut out along a longitudinal fold line of the carrier tape that is appropriately positioned relative to the retaining fingers to permit this desired flexing of the tape.

Several configurations and combinations of elements to form a gated-pocket tape-form packaging system embodying this invention have been shown. However, it is to be recognized that these specific embodiments are considered to be illustrative examples and not limitations as to specific structures and configurations. For example, the material from which the carrier tape, or for that matter the cover tape, is formed in those embodiments depends upon the structural strength and rigidity that is required for the specific articles that are to be packaged. Similarly, the width of tapes is dependent upon the articles which are to be packaged and the width may be proportionally greater or less than that which is illustrated in the drawing figures. The thickness of the specific tapes may be varied in accordance with particular structural requirements. Also, the configuration of the pockets is dictated by the requirements for the specific articles that are to be packaged in this system. Those pockets, while illustrated as being essentially of a rectangular shape, may be of other-configurations, whether it is to closely mechanically interfit with the particular articles or if they are to be of a size to accommodate a plurality of articles in each of the pockets. In the latter instance, this would be particularly true of the system where the retaining means includes the combination of the retaining fingers and cover tape that cooperate to perform the gating function with respect to a pocket. Also, the configuration and structure of the retaining fingers may be other than that which is illustrated in the several embodiments. The size of the fingers may be proportionally different than that illustrated, but of a design that will provide either the direct mechanical interengagement with the articles to effect gating or, as is appropriate, to cooperate with a cover tape to effect the gating function. The technique of forming those fingers is also subject to variation as may be determined appropriate for a particular construction or packaging.

It will be readily apparent from the foregoing detailed disclosure of the several embodiments of this invention that a particularly novel and advantageous tape-form packaging system is provided. This packaging system is particularly advantageous in that it incorporates a gating mechanism for effecting retention of articles in the respective pockets and which gating mechanism may be subject to mechanical manipulation to effect its operation. The particular technique of manipulating the tapes is dependent upon the specific structure and configurations of the tape or tapes and the articles that are to be retained in the respective pockets. The particular mechanisms for manipulating the tapes is not a part of this invention and would be determined as most appropriate for particular structures. The advantageous gating mechanism is present with respect to either the structure which includes only the retaining fingers to perform that gating function or if it is in combination of both retaining fingers and a cover tape. In the form which includes a cover tape, the packaging system has the dual advantages of providing not only the relatively full protection for articles that are retained in the respective pockets, but the utilization of retaining fingers to mechanically secure the cover tape to the carrier tape readily permits the longitudinal displacement of those two tapes relative to each other and thereby accommodate the variations in longitudinal length that occur when a tape packaging system of this nature is wound up onto a reel for conservation of storage space as well as economy of transport.

Having thus described this invention, what is claimed is:

1. A gated-pocket, tape-form packaging system for packaging of a plurality of articles comprising an elongated, strip-form carrier tape having opposed longitudinally extending edges and a first face extending between said edges, said carrier tape having a plurality of article-receiving pockets carried by said tape between its longitudinal edges and disposed seriatim along a longitudinal axis of said tape, each of said pockets defining a cavity having a configuration adapted to receive an article therein and formed with an opening at said carrier tape's first face through which an article can enter into or exit from a respective pocket, and article-retaining means carried by said carrier tape and disposed in a first position with respect to the openings of said pockets for maintaining of articles in respective pockets, said article-retaining means selectively displaceable to a second position that is in non-obstructing relationship to a respective pocket to permit displacement of an article into or out of that pocket, said article-retaining means including a plurality of elongated retaining fingers secured to said carrier tape in at least one row extending longitudinally of said carrier tape along a respective marginal edge portion of said carrier tape in spaced relationship to each other and intermediate a longitudinal edge of said carrier tape and the adjacent longitudinally extending edge of said pockets, each of said retaining fingers extending transversely across said carrier tape in overlying relationship to said carrier tape's first face and projecting a distance over the opening of a respective pocket to obstruct displacement of an article through the opening of a respective pocket, at least one retaining finger in said row disposed in operative relationship to each of said pockets whereby flexing of the marginal edge portion of said carrier tape in a direction opposite to its first face about a longitudinal axis of said carrier tape to a predetermined extent effects displacement of said finger to a position where it does not obstruct displacement of an article through the opening of a respective pocket.

2. A packaging system according to claim 1 wherein said pockets are formed with a configuration that mechanically interfits with the article to be contained therein to maintain the article when positioned in a pocket in a substantially fixed position relative to said carrier tape.

3. A packaging system according to claim 1 wherein said pockets are of a depth to fully receive an article therein and said article-retaining means extending over the opening of each of said pockets when disposed in said first position.

4. A packaging system according to claim 1 wherein said pockets are integrally formed in said carrier tape and project laterally from the plane of said carrier tape in a direction opposite from said first face.

5. A packaging system according to claim 1 wherein said carrier tape is formed from a material that exhibits a characteristic flexibility enabling it to be coiled into a reel about axes disposed transverse to its longitudinal axis.

6. A packaging system according to claim 1 wherein a plurality of said fingers project over each of said pockets.

7. A packaging system according to claim 1 wherein said fingers lie in a plane that is substantially parallel to the surface of said carrier tape's first face.

8. Packaging system according to claim 1 wherein said fingers are of a tubular configuration integrally formed with said carrier tape.

9. A gated-pocket, tape-form packaging system for packaging of a plurality of articles comprising an elongated, strip-form carrier tape having opposed longitudinally extending edges and a first face extending between said edges, said carrier tape having a plurality of article-receiving pockets carried by said tape between its longitudinal edges and disposed seriatim along a longitudinal axis of said tape, each of said pockets defining a cavity having a configuration adapted to receive an article therein and formed with an opening at said carrier tape's first face through which an article can enter into or exit from a respective pocket, and article-retaining means carried by said carrier tape and disposed in a first position with respect to the openings of said pockets for maintaining of articles in respective pockets, said article-retaining means selectively displaceable to a second position that is in non-obstructing relationship to a respective pocket to permit displacement of an article into or out of that pocket, said article-retaining means including A) an elongated cover tape extending longitudinally of said carrier tape in overlying relationship to said carrier tape's first face and the openings to said pockets, said cover tape being flexible to bend about axes extending transversely to the longitudinal axis of said cover tape and of flat strip-form having opposed longitudinal edges, and of a width less than that of the carrier tape with at least one longitudinal edge of said cover tape disposed a distance inwardly of a respective longitudinal edge of said carrier tape, and B) a plurality of retaining fingers for mechanically securing of said cover tape to said carrier tape, said retaining fingers secured to said carrier tape along a marginal edge portion of said carrier tape in a longitudinally extending row in spaced relationship to each other intermediate a longitudinal edge of said carrier tape and an adjacent longitudinal edge of said cover tape, said retaining fingers extending transversely of and in overlying relationship to said carrier tape's first face and projecting a distance over a longitudinal marginal edge portion of said cover tape for maintaining said cover tape in overlying relationship to said carrier tape and to permit relative longitudinal displacement of said cover tape with respect to said carrier tape.

10. A packaging system according to claim 9 wherein said cove tape is positioned on said carrier tape with each of its longitudinal edges disposed a distance inwardly of a respective adjacent longitudinal edge of said carrier tape, and said retaining fingers are disposed in longitudinally extending rows at each side of said cover tape.

11. A packaging system according to claim 10 wherein said cover tape is of a width substantially equal to the transverse width of said pockets.

12. A packaging system according to claim 9 wherein at least one retaining finger is positioned adjacent each of said pockets.

13. A packaging system according to claim 9 wherein said cover tape is of a width greater than the transverse width of said pockets and is disposed on said carrier tape with each of its longitudinal edges positioned intermediate a respective longitudinal edge of said carrier tape and adjacent edges of said pockets.

14. A gated-pocket, tape-form packaging system for packaging of a plurality of articles comprising an elongated, strip-form carrier tape having opposed longitudinally extending edges and a first face extending between said edges, said carrier tape having a plurality of article-receiving pockets carried by said tape between its longitudinal edges and disposed seriatim along a longitudinal axis of said tape, each of said pockets defining a cavity having a configuration adapted to receive an article therein and formed with an opening at said carrier tape's first face through which an article can enter into or exit from a respective pocket, and article-retaining means carried by said carrier tape and disposed in a first position with respect to the openings of said pockets for maintaining of articles in respective pockets, said article-retaining means selectively displaceable to a second position that is in non-obstructing relationship to a respective pocket to permit displacement of an article into or out of that pocket to permit displacement of an article into or out of that pocket, said article-retaining means including a plurality of elongated fingers carried by said carrier tape with each finger projecting a distance over the opening of a respective pocket to obstruct displacement of an article through said opening, said fingers being secured to said carrier tape along a marginal edge portion thereof in laterally outward relationship to said pockets whereby flexing of the marginal edge portion of said carrier tape in a direction opposite to its said first face about a longitudinal axis of said carrier tape to a predetermined extent effects displacement of said fingers to a position where they do not obstruct displacement of an article through the opening of a respective pocket, said fingers being of a tubular configuration integrally formed with said carrier tape.

15. A gated-pocket, tape-form packaging system for packaging of a plurality of articles comprising an elongated, strip-form carrier tape having opposed longitudinally extending edges and a first face extending between said edges, said carrier tape having a plurality of article-receiving pockets carried by said tape between its longitudinal edges and disposed seriatim along a longitudinal axis of said tape, each of said pockets defining a cavity having a configuration adapted to receive an article therein and formed with an opening at said carrier tape's first face through which an article can enter into or exit from a respective pocket, and article-retaining means carried by said carrier tape and disposed in a first position with respect to the openings of said pockets for maintaining of articles in respective pockets, said article-retaining means selectively displaceable to a second position that is in non-obstructing relationship to a respective pocket to permit displacement of an article into or out of that pocket, said article-retaining means including A) an elongated cover tape extending longitudinally of said carrier tape in overlying relationship to said carrier tape's first face and the openings to said pockets, said cover tape being flexible to bend about axes extending transversely to the longitudinal axis of said cover tape and of flat strip-form having opposed longitudinal edges, and of a width less than that of the carrier tape with at least one longitudinal edge of said cover tape disposed a distance inwardly of a respective longitudinal edge of said carrier tape, and B) a plurality of retaining fingers for mechanically securing of said cover tape to said carrier tape, said retaining fingers secured to said carrier tape along a marginal edge portion of said carrier tape in spaced relationship to each other intermediate a longitudinal edge of said carrier tape and an adjacent longitudinal edge of said cover tape, said retaining fingers extending in overlying relationship to said carrier tape's first face and projecting a distance over a longitudinal marginal edge portion of said cover tape for maintaining said cover tape in overlying relationship to said carrier tape and to permit relative longitudinal displacement of said cover tape with respect to said carrier tape, said retaining fingers disposed in longitudinally extending rows at each side of said cover tape, and C) said cover tape is positioned on said carrier tape with each of its longitudinal edges disposed a distance inwardly of a respective adjacent longitudinal edge of said carrier tape, of a width substantially equal to the transverse width of said pockets.

16. A gated-pocket, tape-form packaging system for packaging of a plurality of articles comprising an elongated, strip-form carrier tape having opposed longitudinally extending edges and a first face extending between said edges, said carrier tape having a plurality of article-receiving pockets carried by said tape between its longitudinal edges and disposed seriatim along a longitudinal axis of said tape, each of said pockets defining a cavity having a configuration adapted to receive an article therein and formed with an opening at said carrier tape's first face through which an article can enter into or exit from a respective pocket, and article-retaining means carried by said carrier tape and disposed in a first position with respect to the openings of said pockets for maintaining of articles in respective pockets, said article-retaining means selectively displaceable to a second position that is in non-obstructing relationship to a respective pocket to permit displacement of an article into or out of that pocket, said article-retaining means including A) an elongated cover tape extending longitudinally of said carrier tape in overlying relationship to said carrier tape's first face and the openings to said pockets, said cover tape being flexible to bend about axes extending transversely to the longitudinal axis of said cover tape and of flat strip-form having opposed longitudinal edges, and of a width less than that of the carrier tape with at least one longitudinal edge of said cover tape disposed a distance inwardly of a respective longitudinal edge of said carrier tape, said cover tape is of a width less than the transverse width of said pockets with at least one of the longitudinal edges of said cover tape disposed in relatively inwardly spaced relationship to one of the longitudinally extending sides of said pockets, and B) a plurality of retaining fingers for mechanically securing of said cover tape to said carrier tape, said retaining fingers secured to said carrier tape along a marginal edge portion of said carrier tape in spaced relationship to each other intermediate a longitudinal edge of said carrier tape and an adjacent longitudinal edge of said cover tape, said retaining fingers extending in overlying relationship to said carrier tape's first face and projecting a distance over a longitudinal marginal edge portion of said cover tape for maintaining said cover tape in overlying relationship to said carrier tape and to permit relative longitudinal displacement of said cover tape with respect to said carrier tape, said fingers that extend in cooperative engagement with that side edge of said cover tape are secured to said carrier tape at positions intermediate adjacently disposed pockets.

17. A gated-pocket, tape-form packaging system for packaging of a plurality of articles comprising an elongated, strip-form carrier tape having opposed longitudinally extending edges and a first face extending between said edges, said carrier tape having a plurality of article-receiving pockets carried by said tape between its longitudinal edges and disposed seriatim along a longitudinal axis of said tape, each of said pockets defining a cavity having a configuration adapted to receive an article therein and formed with an opening at said carrier tape's first face through which an article can enter into or exit from a respective pocket, and article-retaining means carried by said carrier tape and disposed in a first position with respect to the openings of said pockets for maintaining of articles in respective pockets, said article-retaining means selectively displaceable to a second position that is in non-obstructing relationship to a respective pocket to permit displacement of an article into or out of that pocket, said article-retaining means including A) an elongated cover tape extending longitudinally of said carrier tape in overlying relationship to said carrier tape's first face and the openings to said pockets, said cover tape being flexible to bend about axes extending transversely to the longitudinal axis of said cover tape and of flat strip-form having opposed longitudinal edges, and of a width less than that of the carrier tape with at least one longitudinal edge of said longitudinal edge of said carrier tape, said cover tape is of a width substantially less than the transverse width of said pockets and is positioned on said carrier tape with the longitudinal edges at each side of said cover tape disposed in relatively inwardly spaced relationship to each of the longitudinally extending sides of said pockets, and B) a plurality of retaining fingers for mechanically securing of said cover tape to said carrier tape, said retaining fingers secured to said carrier tape along a marginal edge portion of said carrier tape in spaced relationship to each other intermediate a longitudinal edge of said carrier tape and an adjacent longitudinal edge of said cover tape and secured to said carrier tape at positions intermediate adjacently disposed pockets, said retaining fingers extending in overlying relationship to said carrier tape's first face and projecting a distance over a longitudinal marginal edge portion of said cover tape for maintaining said cover tape in overlying relationship to said carrier tape and to permit relative longitudinal displacement of said cover tape with respect to said carrier tape.

* * * * *